INVENTOR.
EUGENE L. ENGELS
BY Seidel & Gonda
ATTORNEYS.

INVENTOR.
EUGENE L. ENGELS
BY Seidel & Gonda
ATTORNEYS.

United States Patent Office 3,341,030

Patented Sept. 12, 1967

3,341,030

METHOD AND APPARATUS FOR POSITIONING AND ORIENTATING ARTICLES

Eugene L. Engels, 8333 Williams Ave., Philadelphia, Pa. 19150

Filed Mar. 29, 1965, Ser. No. 443,464

13 Claims. (Cl. 214—1)

This invention relates to a method and apparatus for positioning and orientating articles. More particularly, this invention relates to a method and apparatus for positioning and orientating small articles, such as miniature electronic components, using magnetic principles.

With the rise of miniaturization in all fields of industry, it has been necessary to develop new techniques for handling the tiny articles that are being produced. Thus, in the production of semi-conductor devices, such as diodes, tunnel diodes, transistors, and the like, there is a problem in handling the tiny devices to facilitate the attachment of conducting leads thereto.

Transistors are normally manufactured by growing a single crystal of silicon from a seed crystal. Wafers are cut from the silicon crystal by slicing it transversely to its principal crystal axis. The individual wafers are then processed, on one side only, to produce the junctions necessary for the required semi-conductor function. Since only one side of the crystal wafer is used for the production of the semi-conductor function, the opposite side is passive and serves no special purpose in the device's operation. Many transistors are produced on one wafer of silicon. The wafers are then sectioned by conventional means such as diamond scratching techniques. The resultant product of this operation is tiny blocks of semi-conductor devices in random spatial orientation.

Electrical conducting leads must be affixed to individual blocks to complete the semi-conductor device prior to encapsulating it. In order to apply such conductor leads, it is necessary to spatially reorientate the semi-conductor blocks. Thus, it has heretofore been necessary for a trained technician to properly position and orientate each individual treated silicon block so that the conducting lead can be properly applied. This operation is time-consuming and requires the use of relatively expensive equipment, such as micro-manipulators and microscopes.

The present invention overcomes the foregoing described problem involved in the production of small articles by eliminating the necessity for an operator to position and orientate individual blocks of semi-conductor material. The present invention is accomplished by coating a portion of the articles to be positioned with a magnetized substance, then placing the coated articles on a supporting table having spaced apart magnets adjacent the surface thereof. The table is vibrated thereby causing the articles to move across its surface until such time as they become fixed in position and orientated by the magnets.

It therefore is a general object of the present invention to provide a novel method and apparatus for positioning and orientating articles.

It is another object of this invention to provide a novel method and apparatus for positioning and orientating small articles.

It is yet another object of the present invention to provide a novel method for positioning and orientating a plurality of articles using magnetic principles.

It is still another object of the present invention to provide a novel method for positioning and orientating small articles using magnetic film techniques.

Other objects will appear hereinafter.

For the purpose of illustrating the invention, there is shown in the drawings a form which is presently preferred; it being understood, however, that this invention is not limited to the precise arrangements and instrumentalities shown.

Referring now to the drawings in detail, wherein like numerals indicate like elements, there is shown in FIGURE 1 a silicon crystal used in the manufacture of transistors or other semiconductor devices designated generally as 10.

Figure 1:
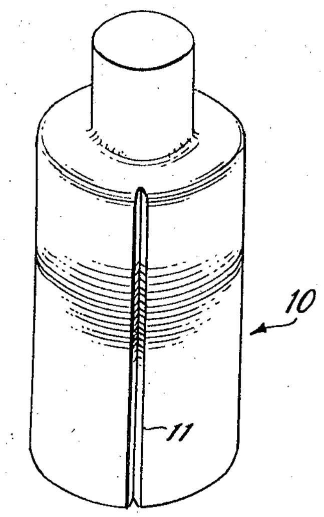
FIGURE 1 is a perspective view of a silicon crystal prior to being cut into wafers.
Figure 2:
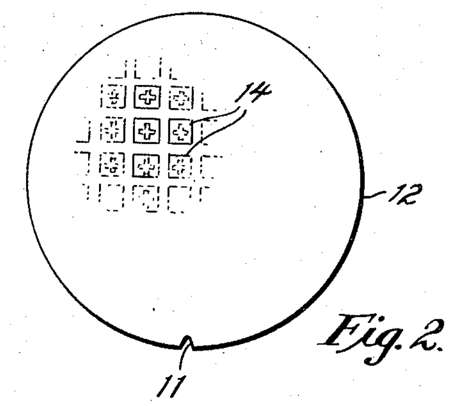
FIGURE 2 is a top plan view of one wafer cut from the crystal shown in FIGURE 1 and processed to produce transistor junctions.

As shown, the crystal 10 has been grown so that the principal crystal axis is parallel to the longitudinal axis of the cylindrical form. In accordance with conventional manufacturing principles, wafers are sliced out of the crystal 10 by cutting it transversely to the principal crystal axis. One such wafer 12 is illustrated in FIGURE 2. As shown, the wafer 12 has been processed on one side only to produce the semi-conductor device, which may have one or a plurality of junctions as required for the semi-conductor function. As many as several hundred such semi-conductor devices are produced on the surface of one wafer of silicon. Such devices, designated generally as 14, are shown on the wafer in FIGURE 2.

The devices 14 have been greatly enlarged for purposes of illustrating the invention.

Figure 5:
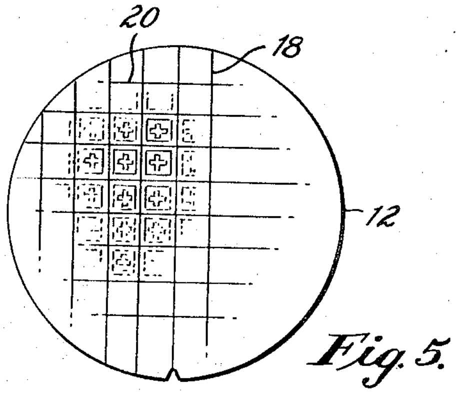
FIGURE 5 is a plan view of the obverse side of the wafer shown in FIGURE 4, showing the score lines prior to sectioning.
Figure 6:
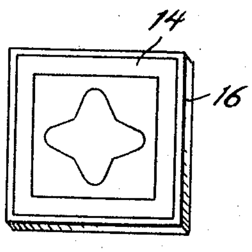
FIGURE 6 is an enlarged view of a single square sectioned from the wafer shown in FIGURE 5.

At this point in the process of manufacturing the devices 14, it is normal to score the wafer 12 by diamond scratching techniques. Such score lines 18 and 20 are shown in FIGURE 5. After scoring, the wafer 12 is broken into a plurality of blocks 16 such as are shown in FIGURE 6. The next step in manufacturing the semi-conductor devices would ordinarily be to attach conducting leads 22 such as those shown in FIGURE 11. The final step in manufacturing the device would be to encapsulate the block 16.

Figure 3:
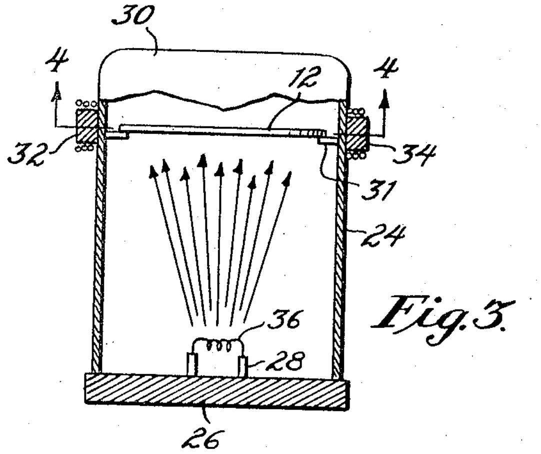
FIGURE 3 is a partial sectional view of an apparatus for depositing a magnetized substance on the passive surface of a wafer cut from the crystal shown in FIGURE 1.

In accordance with the principles of the present invention, the foregoing method is modified as follows. Thus, the semi-conductor materials are conventionally handled until the scoring operation. Prior to the scoring operation, the wafer 12 is mounted within vacuum deposition apparatus and a magnetic film is deposited on the passive side thereof. Thus, referring to FIGURE 3, the wafer 12 is shown mounted within the vacuum coating apparatus 24. The apparatus 24 includes a base 26 supporting a source 28 within the bell jar 30. The bell jar 30 supports the wafer 12 and a pair of electromagnets 32 and 34 adjacent thereto.

In accordance with conventional techniques, current is applied to the source 28 to raise the temperature of the coating substance 36 to vaporization temperatures. Since the atmosphere within the jar will have previously been reduced to extremely low pressures, the escaping molecules of the coating substance 36 will have a long, mean free flow path and hence will impinge and condense on the passive surface of wafer 12. The support 31 is designed to prevent coating of any surface other than the passive surface.

Figure 4:
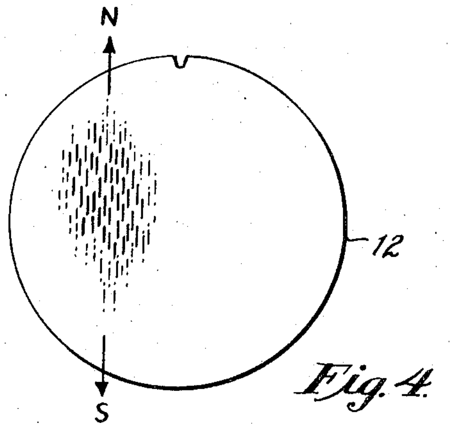
FIGURE 4 is an enlarged view of the wafer supported in the apparatus of FIGURE 3, taken along the line 4—4 schematically illustrating the film of vacuum deposited substance.

During condensation the wafer 12 is subjected to a magnetic flux of high intensity created by electromagnets 32 and 34 sufficient to cause polarization or alignment of the magnetic domain within the film. This results in providing a magnetized film on the passive surface of wafer 12. It is to be understood that only the obverse surface shown in FIGURES 2 and 5 have materials applied thereon to form the semi-conductor devices. The back surface shown in FIGURE 4 is entirely passive and normally plays no part in the operation of the semi-conductor device.

For reasons that will become more clear below, the wafer 12 is positioned in a predetermined orientation relative to the magnetic field vector of the electromagnets 32 and 34. Therefore, the magnetic film deposited on the wafer 12 will have a predetermined orientation. Proper orientation is achieved by providing the crystal 10 with an index groove 11 which can be aligned with a mating mark on support 33.

The magnetic film deposited on wafer 12 should be uniaxially anisotropic and have a high coercivity and a low degree of magnetic dispersion. Thus, the electromagnets 32 and 34 align the electron spins in a direction of easy magnetization. An intense magnetic field produced by the electromagnets 32 and 34 aligns the electron spins of the substance 36. It is necessary to have a low magnetic dispersion to assure that the components of the magnetic dipole vectors that are perpendicular to the axis of preferred magnetization approach or are equal to zero. ($\alpha$ approaches or equals zero.) This eliminates the possibility of having magnetization in a direction other than that preferred. The magnetized film should have a high remanent magnetism. This is illustrated by the schematic of the dipoles showing parallel alignment and a north-south pole. The substance 36 may be an alloy of iron, nickel, chromium, manganese, cobalt or various combinations of the preceding.

Following the deposition of the magnetic substance on the passive surface of wafer 12, it is sectioned by the conventional techniques described above. Thus, the diamond scratching tool may be applied to the obverse surface of wafer 12 to form the score lines 18 and 20. The wafer is then broken into the blocks 16 shown in FIGURE 6.

Figures 7, 8, 9:
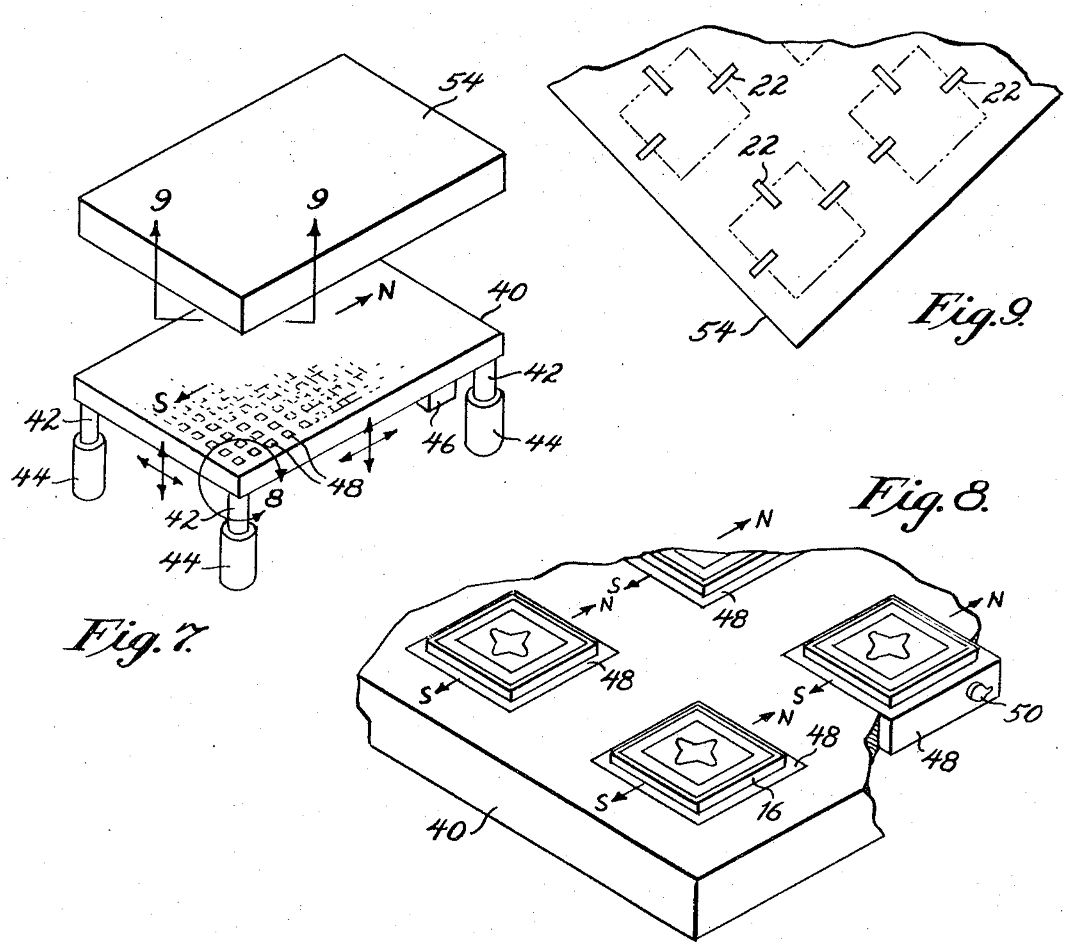
FIGURE 7 is a perspective view of a shaker table and indexing head.
FIGURE 8 is an enlarged view of area 8 in FIGURE 7.
FIGURE 9 is a partial view of the indexing head shown in FIGURE 7 taken along the line 9—9.

After the wafer 12 has been sectioned into blocks 16, they are placed on a shaker table 40 which is supported by four legs 42 mounted within hydraulic cylinders 44. The vibrator 46 is mounted to the lower surface of table 40 for selectively vibrating the same. As best shown in FIGURE 8, the table 40 has a plurality of magnets 48 flush with the surface thereof. Each of these magnets 48 is aligned with its poles in a predetermined disposition. Thus, each of the magnets 48 shown in FIGURE 8 may be aligned with its north pole pointing in the same direction. While the magnets 48 may be permanent magnets having a predetermined field intensity, it is also within the scope of this invention to provide electromagnets which may be adjusted in field intensity. Thus, the knob 50 may be connected to a rheostat in electrical circuit which supplies energy for an electromagnet 48. By adjusting the knob 50, the intensity of the magnetic field can be varied.

As indicated above, the blocks 16 are placed on the table 40 following the step of sectioning them from wafer 12. The next step in the operation is to vibrate table 40 by energizing vibrator 46. The vibration applied by vibrator 46 causes the block 16 to slide across the table 40 until the magnetic field of their magnetized passive surfaces comes into the influence of the magnetic field created by magnets 48. Under these conditions the opposite poles of the magnetized substance and the magnets 48 will attract and the blocks 16 will be fixed in position. Since the substance applied to blocks 16 is magnetized in a predetermined field orientation and the magnets 48 are aligned in a predetermined field orientation, the blocks 16 will be aligned as well as positioned on table 40 in a predetermined orientation.

The table 40 may be provided with a magnet 48 for each block 16. The magnets 48 produce an effective field whose size is no larger than the blocks 16 so that only one such block will align itself with each individual magnet 48. For this reason, the magnets 48 may be changed to adjust their effective magnetization field to correctly correspond with the size of the blocks 16. Moreover, the field intensity of the magnets 48 should be adjusted so that it will attract the coated surface of the blocks 16 only if it is juxtaposed the surface of table 40. Thus, if the active side of a block 16 is juxtaposed the surface of table 40 the magnetic field of the magnets 48 will not act through the block 16 to align it until such time as the vibrations from vibrator 46 cause it to reverse itself.

Figure 10:
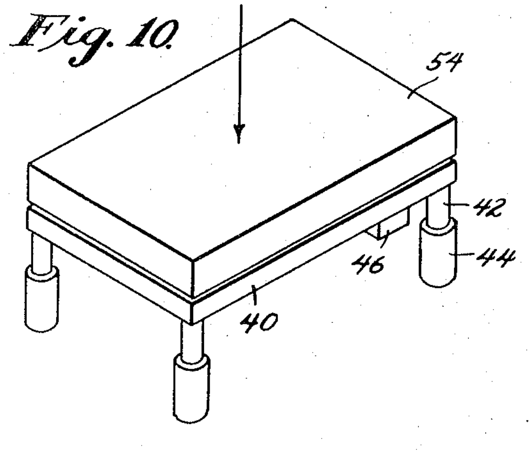
FIGURE 10 is a perspective view similar to that shown in FIGURE 7 illustrating the indexing head at its bonding position.

After the blocks 16 have been properly positioned and aligned by table 14, an indexing head 54 may be brought to bear upon the blocks 16. Thus, referring to FIGURE 9, the indexing head 54 is shown supporting a plurality of conducting leads 22 that are to be bonded to blocks 16. The leads 22 are supported by the indexing head 54 in their proper orientation relative to the position of blocks 16 on table 40. In FIGURE 10, the indexing head 54 is shown in its operative position for bonding the conducting leads 22 to the blocks 16. The legs 42 and hydraulic cylinders 44 resiliently support the table 40 during the bonding step. The indexing head 54 has been shown and described schematically only, as it forms no part of this invention.

Figure 11:
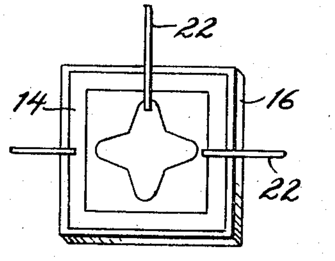
FIGURE 11 is an enlarged view of a single transistor after the conducting leads have been bonded thereto.

FIGURE 11 illustrates the completed semi-conductor having the conducting leads 22 bonded thereto.

The method and apparatus of this invention have been described with particular reference to the application of conducting leads to a semi-conductor device. However, it will readily be recognized by those skilled in the art that the invention is not so limited. This invention has other applications such as the fabrication of micro-circuits and for the positioning and aligning of articles, particularly small articles which require special instruments in their handling. Furthermore, the invention can be used in testing operations since all of the bonded leads would be like orientated and congruent. Testing could be carried out in much the same way as bonding, except the indexing head would carry contacts and measuring equipment.

The present invention may be embodied in other specific forms without departing from the spirit or essential attributes thereof and, accordingly, reference should be made to the appended claims, rather than to the foregoing specification as indicating the scope of the invention.

I claim:

1. A method of positioning a non-magnetic article comprising the steps of coating a passive surface of said article with a film of magnetic substance and magnetizing said coating in a predetermined magnetic field vector orientation relative to said article, placing said coated articles on a supporting means including at least one magnet at a predetermined position, and vibrating said supporting means to cause said coated article to move into magnetic alignment with the magnetic field of said magnet.

2. A method of positioning a plurality of non-magnetic articles comprising the steps of coating a passive surface of said articles with a film of magnetic substance, magnetizing said coating in a predetermined magnetic field vector orientation relative to said articles, placing said coated articles on a supporting means, said supporting means including a plurality of magnets at predetermined spaced apart positions, and vibrating said supporting means to cause individual coated articles to move into magnetic alignment with the individual magnetic fields of said magnets.

3. A method of magnetically, simultaneously orientating and positioning a plurality of non-magnetic articles comprising the steps of coating a passive portion of said articles with a film of magnetic substance magnetized in a predetermined magnetic field vector orientation relative to said articles, placing said coated articles on a supporting means, said supporting means including a plurality of magnets at predetermined spaced apart positions and predetermined magnetic field vector alignments, and vibrating said surface to cause individual coated articles to move into magnetic alignment with the magnetic field vector of individual magnets.

4. A method of positioning a plurality of non-magnetic articles comprising the steps of depositing on said articles a magnetized film that is uniaxially anisotropic, placing said articles on a supporting surface, providing a plurality of magnetic means juxtaposed said surface, orienting the field vector of said magnetic means in a predetermined direction and vibrating said surface to cause individual articles to become fixed in the magnetic field of each of said magnetic means.

5. A method of positioning a plurality of non-magnetic articles comprising the steps of depositing on said articles a uniaxially anisotropic magnetic film having a high coercivity and a low degree of magnetic dispersion, placing said articles on a supporting surface, providing a plurality of magnetic means juxtaposed to said surface, orienting the field vector of said magnetic means in a predetermined direction, and vibrating said surface to cause individual articles to become fixed in the magnetic field of said magnet.

6. A method of simultaneously orientating and positioning a plurality of small articles comprising the steps of coating a passive surface of said articles with a film of magnetic substance magnetized in a predetermined magnetic field vector orientation relative to said articles, placing said coated articles on a supporting surface, providing a plurality of magnets adjacent to said surface at predetermined spaced apart positions and predetermined magnetic field vector alignments, adjusting the effective field size of said magnets to be substantially equal to the size of said articles, and vibrating said surface to cause individual coated articles to move into magnetic alignment with magnetic field vector of individual magnets.

7. In the process of manufacturing semi-conductor devices, a method of positioning and orientating said devices comprising the steps of coating the passive surface of a semi-conductor wafer with a uniaxially anisotropic magnetized film having a high coercivity and a low degree of magnetic dispersion, magnetizing said film in a predetermined magnetic field vector orientation relative to said wafer, the obverse side of said wafer being divided into a plurality of discreet areas supporting means for forming a semi-conductor junction, sectioning said wafer into a plurality of small semi-conductors, placing said semi-conductor on a supporting surface, providing a plurality of magnets adjacent said surface at predetermined spaced apart positions and predetermined magnetic field vector alignments, adjusting the effective field size of said magnets to be substantially equal to the size of said articles, adjusting the magnetic field intensity of said magnets so that the magnetic field of said semi-conductors will align with said magnet fields only if said obverse side is remote from said surface, and vibrating said surface to cause individual semi-conductors to move into magnetic alignment with the magnetic field vector of individual magnets.

8. A method of simultaneously orientating and positioning a plurality of small articles comprising the steps of coating a passive surface of said articles with a film of magnetic substance magnetizing in a predetermined magnetic field vector orientation relative to said articles, placing said coated articles on a supporting surface, providing a plurality of magnets adjacent said surface at predetermined spaced apart positions and predetermined magnetic field vector alignments, adjusting the effective field size of said magnets to be substantially equal to the size of said articles, adjusting the magnetic field intensity of said magnets so that the magnetic fields of said coated articles will align with said magnet fields only if the side opposite said passive side is remote from said surface, and vibrating said surface to cause individual coated articles to move into magnetic alignment with the magnetic field vector of individual magnets.

9. Apparatus for simultaneously spatially orientating and positioning a plurality of small articles comprising a supporting surface, a plurality of magnets adjacent to said surface, said magnets being positioned at predetermined spaced apart positions in predetermined field vector coalignment, a plurality of articles to be positioned and aligned supported on said surface, said articles being coated with a film of magnetic substance magnetized in a predetermined magnetic field vector orientation relative to said articles, means for adjusting the effective field size of said magnets to substantially the size of said articles, and means for vibrating said surface to cause the coating on individual articles to move into magnetic field vector alignment with the magnetic field of individual magnets.

10. Apparatus in accordance with claim 9 wherein said coating comprises a thin uniaxially anisotropic magnetized film having a high coercivity and a low degree of magnetic dispersion.

11. Apparatus in accordance with claim 9 wherein said article is coated on one side, and means for adjusting the intensity of said magnets so that the magnetic field of said articles will align with the magnetic field of said magnets only if the side opposite said coated side is remote from said surface.

12. A method of orientating and positioning at least one small article of non magnetizable material comprising the steps of depositing on a passive surface of said article a film of magnetic substance, for the primary purpose of orienting and positioning said article, magnetizing said film in a predetermined magnetic field vector orientation relative to said article, placing said article on a supporting surface, providing at least one magnet adjacent to said surface having a predetermined magnetic field alignment, and causing said article to move into magnetic alignment with the magnetic field vector of said magnet.

13. A method of simultaneously orientating and positioning a plurality of small articles of non magnetizable material comprising the steps of coating a passive surface of said articles with a film of magnetic substance for the primary purpose of orienting and positioning said articles, magnetizing said substance in a predetermined magnetic field vector orientation relative to said articles, placing said coated articles on a supporting surface, providing a plurality of magnets adjacent to said surface at predetermined spaced apart positions and predetermined magnetic field vector alignments, adjusting the effective field size of said magnets to be substantially equal to the size of said articles, and causing said articles to move into magnetic alignment with the magnetic field vector of said magnets.

References Cited

UNITED STATES PATENTS

| | | | |
|---|---|---|---|
| 2,823,781 | 2/1958 | Bosch | 193—43 |
| 2,900,282 | 8/1959 | Rubens | 118—49.1 X |
| 3,118,564 | 1/1964 | Vokes | 317—203 X |
| 3,120,890 | 2/1964 | Waltz | 198—33 |
| 3,127,000 | 3/1964 | Tack | 198—33.1 |

GERALD M. FORLENZA, *Primary Examiner.*

MARVIN A. CHAMPION, *Examiner.*